(12) United States Patent
Goldstein et al.

(10) Patent No.: US 7,666,555 B2
(45) Date of Patent: Feb. 23, 2010

(54) PELLICLE, METHODS OF FABRICATION AND METHODS OF USE FOR EXTREME ULTRAVIOLET LITHOGRAPHY

(75) Inventors: Michael Goldstein, Ridgefield, CT (US); Yashesh Shroff, Santa Clara, CA (US); Daniel Tanzil, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 343 days.

(21) Appl. No.: 11/618,487

(22) Filed: Dec. 29, 2006

(65) Prior Publication Data

US 2008/0158535 A1 Jul. 3, 2008

(51) Int. Cl.
*G03F 1/00* (2006.01)
*A47G 1/12* (2006.01)
(52) U.S. Cl. .............................. 430/5; 428/14
(58) Field of Classification Search .................. 430/5; 428/14; 355/67; 378/35
See application file for complete search history.

(56) References Cited

U.S. PATENT DOCUMENTS

| 6,825,988 | B2 | 11/2004 | Bristol |
| 7,153,615 | B2 * | 12/2006 | Bristol et al. ................. 430/5 |
| 7,456,932 | B2 * | 11/2008 | Bakker et al. ................. 355/67 |
| 2006/0245058 | A1 | 11/2006 | Van Herpen et al. |

OTHER PUBLICATIONS

Hunter, S., "Keeping the 'More' in Moore's Law", Science & Technology Review, (Mar. 1998), 4 pages.
Mack, C. A., "The Lithography Expert: Using the normalized image log-slope Part 6: Development Path", Microlithography World, (May 2002), 5 pages.
Powell, F. R., et al., "Filter windows for EUV lithography", Proc. SPIE, vol. 4343, Emerging Lithographic Technologies V, (2001), 585-589.
Shroff, Y. A., et al., "Development of EUV Pellicle for Reticle Defect Mitigation", EUVL Symposium 2006, Intel Corporation, Barcelona, (Oct. 18, 2006), 29 pages.
Shroff, et al., "EUV Pellicle Development for Mask Defect Control", Proc. of SPIE, vol. 6151, (2006), 10 pages.

* cited by examiner

*Primary Examiner*—Stephen Rosasco
(74) *Attorney, Agent, or Firm*—Blakely, Sokoloff, Taylor & Zafman LLP (57) ABSTRACT

Embodiments of a pellicle, methods of fabrication and methods of use in extreme ultraviolet (EUV) photolithography are disclosed. The pellicle may include a wire mesh with a square or hexagonal geometric configuration. A thin film of a material with a high Young's modulus may be coated on at least one surface of the wire mesh. A method of fabrication may include forming at least one sacrificial layer on a surface of the wire mesh, forming a thin film on another surface of the wire mesh, and removing the sacrificial layer to form a pellicle. A method of use may include positioning a pellicle relative to a photomask to protect the photomask from particulate accumulation during an EUV photolithography process.

9 Claims, 6 Drawing Sheets

PELLICLE, METHODS OF FABRICATION AND METHODS OF USE FOR EXTREME ULTRAVIOLET LITHOGRAPHY

FIELD OF INVENTION

Extreme ultraviolet lithography.

BACKGROUND OF INVENTION

Photolithography, or optical lithography, is a process used in semiconductor device fabrication to transfer a pattern from a photomask (also called reticle) to the surface of a substrate. Crystalline silicon in the form of a wafer can be used as a choice of substrate, although there are several other options including, but not limited to, glass, sapphire, and metal.

Photolithography generally involves a combination of substrate preparation, photoresist application, soft-baking, exposure developing, hard-baking, etching and various other chemical treatments (thinning agents, edge-bead removal) in repeated steps on an initially flat substrate. A cycle of a typical silicon lithography procedure can begin by depositing a layer of conductive metal several nanometers thick on the substrate. A layer of photoresist is applied on top of the metal layer. A transparent plate with opaque areas printed on it, called a photomask or reticle (hereinafter used interchangeably), is placed between a source of illumination and the wafer, selectively exposing parts of the substrate to light. Then the photoresist is developed, in which areas of unhardened photoresist undergo a chemical change, such as, for example, polymerization. After a hard-bake, subsequent chemical treatments remove portions of the conductor under the developed photoresist, and then remove the remaining hardened photoresist, leaving conductor exposed in the pattern of the original photomask.

Conventional photolithography uses a light source with a wavelength in the deep ultraviolet range (DUV), or between 250 nanometers and 193 nanometers (nm) in the exposure developing operation. Generally, the shorter the wavelength, the smaller the feature. For example, wavelengths of 250 nm result in features of about 0.25 micrometers ($\mu m$), and wavelengths of 193 nm result in features of about 0.13 $\mu m$. Smaller features are desirable for faster and more efficient chips. Recently, the use of extreme ultraviolet light (EUV) has been used to create even smaller features compared to conventional lithography techniques. EUV includes wavelengths in a range from 1 nm to 31 nm. EUV in photolithography can produce patterned features of less than 0.05 $\mu m$. EUV photolithography, generally performed at 13 nm, uses a series of mirrors to circumvent the absorptive nature of EUV wavelengths.

Due to the intricate techniques which must be used in EUV lithography, particle contamination has presented a challenge in creating substantially defect-free reticles. In conventional photolithography, a pellicle situated between the light source and the photomask can be used to trap particulate contaminates. A "pellicle" is a transparent membrane stretched over a frame to protect a photomask. In EUV lithography, however, these pellicles are typically not used because they are generally organic-based and highly absorptive. This results in very expensive defect detection and repair techniques, such as thermophoresis, in particular for particles less than 80 nm. "Thermophoresis" is a process by which a reticle is heated, creating a temperature gradient between the air above the reticle and the surface of the reticle. Because photolithography is performed in a vacuum, however, this technique is inadequate to remove particles because there is no air in which to create the temperature gradient. Laser ablation can also be used to repair defects, however, current technology only allows particles of greater than 60 nm to be detected.

DETAILED DESCRIPTION

Figure 1A:
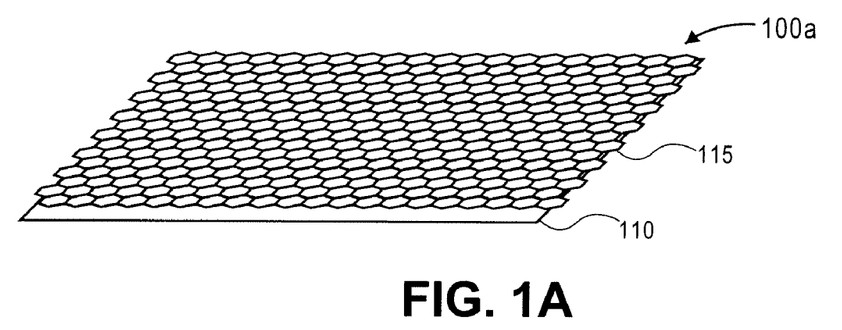
FIG. 1A shows a perspective view of an embodiment of a pellicle (without a frame) which can be used in EUV lithography.

FIG. 1A shows a perspective view of an embodiment of a pellicle (without a frame) which can be used in EUV lithography. Pellicle 100a (without a frame) may include a support platform with a plurality of interlocking evenly-spaced members defining a plurality of openings therebetween. In some embodiments, the support platform is a wire mesh. Wire mesh 105 can support film 110, which may be non-organic and transmissive to EUV light. Film 110 may be present within the openings, or cells, of wire mesh 105 and present on at least one surface of wire mesh 105.

Figure 1B:
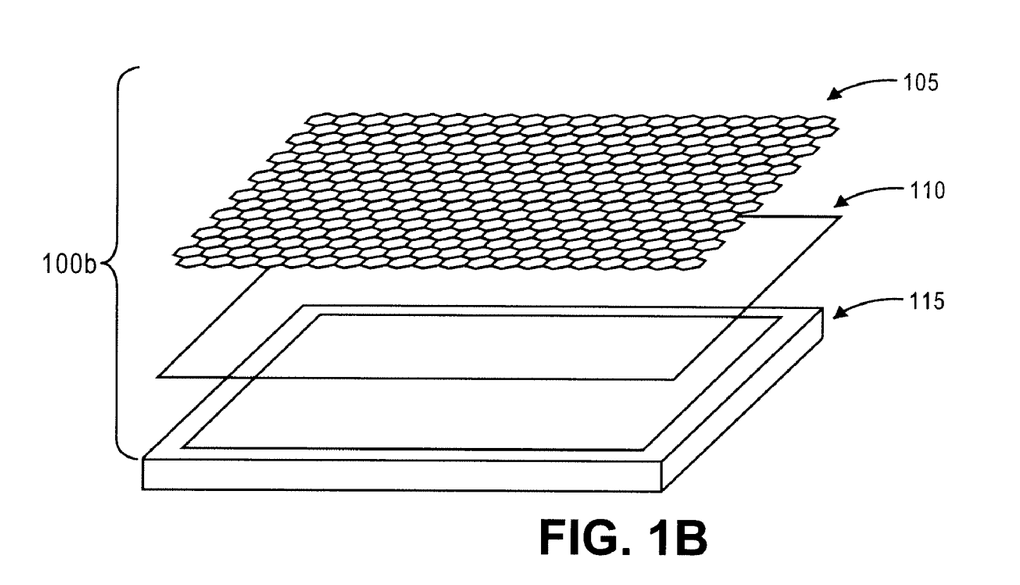
FIG. 1B shows an exploded view of the pellicle of FIG. 1A situated relative to a pellicle frame.

FIG. 1B shows an exploded view of the pellicle of FIG. 1A situated relative to a pellicle frame. Pellicle 100b may be between about 5.5 square inches and about 6 square inches ($in^2$). Pellicle 100b includes wire mesh 105 which may be of a material such as, but not limited to, nickel, tungsten or gold-coated tungsten. In some embodiments, wire mesh 105 has openings with a geometric configuration of squares. In other embodiments, wire mesh 105 has openings with a geometric configuration of hexagons or other polygons. The width of the interlocking members, or wires, that make up wire mesh 105 may be between about 2 $\mu m$ and 20 $\mu m$. The pitch, or width of the openings, may be between about 200 $\mu m$ and 350 μm. Depending on the wire width, pitch and geometric configuration of the openings, wire mesh 105 can be slightly higher than about 95 percent transmissive.

Film 110 may be of a material which is amorphous and tensile when within the cells of wire mesh 105. "Tensile" refers to positive stress. Generally, the more tensile a material, the greater the improvement of transmissiveness. In some embodiments, a material which has a high Young's modulus may be used. Examples of materials which may make up film 110 include, but are not limited to, silicon, silicon ($SiO_2$), silicon carbide (SiC) and niobium. Film 110 may be in a range from about 50 nm to 150 nm. In one embodiment, film 110 is silicon capped with titanium (Ti), titanium-oxide or ruthenium (Ru). The capping layers (one on each side of film 110) prevent oxidation of silicon when exposed to air. In some embodiments, the capping layer is between about 2 nm and 4 nm. Pellicle 110a is supported by pellicle frame 115 which may be, for example, anodized aluminum. Pellicle frame 115 supports pellicle 110a during the fabrication process and during use.

Figure 2A:
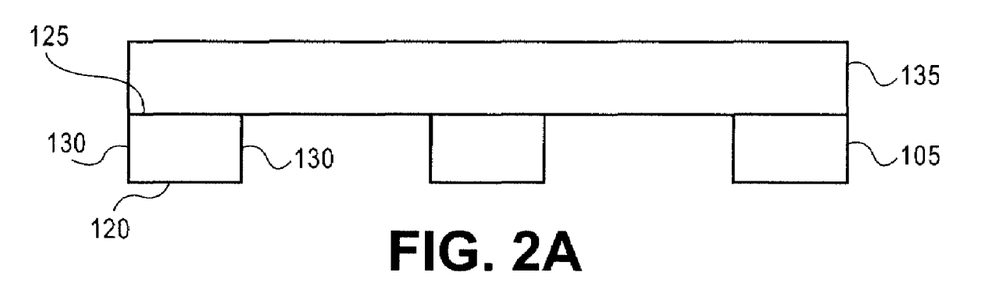
FIG. 2A illustrates forming a first sacrificial layer on a wire mesh according to an embodiment of a method of fabrication of a pellicle for use in EUV lithography.
Figure 2B:
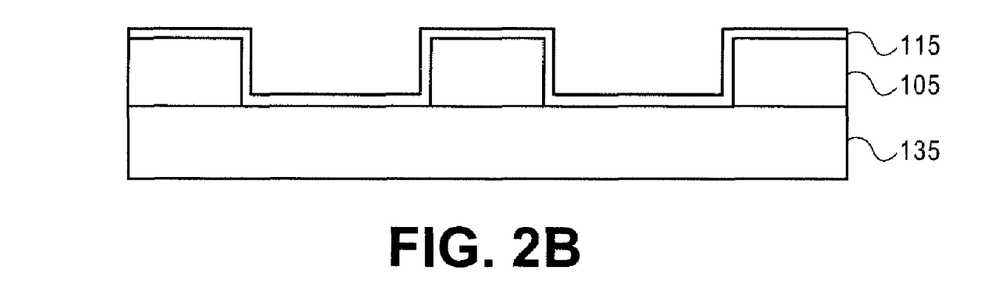
FIG. 2B illustrates forming a thin film on a wire mesh according to an embodiment of a method of fabrication of a pellicle for use in EUV lithography.
Figure 2C:
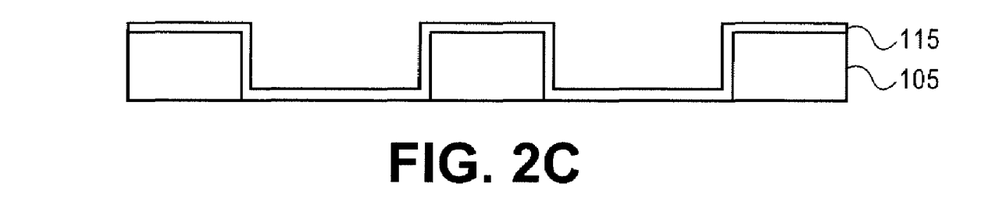
FIG. 2C illustrates removing a first sacrificial layer on a wire mesh according to an embodiment of a method of fabrication of a pellicle for use in EUV lithography.

FIGS. 2A-2C illustrate an embodiment of a method of fabrication of a pellicle for use in EUV lithography. In one embodiment, first sacrificial layer 135 can be deposited on wire mesh 105 (FIG. 2A). Each interlocking member of wire mesh 105 includes two opposing planar surfaces 120 and 125 (e.g., top and bottom surfaces, as viewed), and sidewall surfaces 130. In some embodiments, a high surface tension polymer solution, such as a water-soluble polymer, can be deposited on surfaces 125 of wire mesh 105, forming first sacrificial layer 135. The high surface tension characteristic of the polymer may allow coating on only one surface of wire mesh 105 while leaving sidewall surfaces 130 and opposing surfaces 120 substantially or completely free of the polymer. Examples of such polymers may include, but are not limited to, XP-5769, Protek, ProLift-100, (available from Brewer Science, U.S.A.) or Unity (available from Promerus, LLC, U.S.A). First sacrificial layer 135 may be formed by a process such as dipping.

In one embodiment, the high surface tension polymer solution is poured into a container suitable for a precursor to a pellicle (for example, wire mesh 105) to be seated within. Wire mesh 105 is gently placed on the surface of the polymer solution. Wire mesh is then removed from the polymer solution and allowed to dry in ambient air, forming first sacrificial layer 135 on wire mesh 105. If needed, outgassing can be performed in an oven thereafter. The thickness of first sacrificial layer 135 may be between about 50 μm and 1 millimeter (mm).

FIG. 2B illustrates wire mesh 105 with thin film 115 coated thereon. Thin film 115 may be formed on opposing surface 125 (relative to surface 120) of wire mesh 105. In some embodiments, thin film 115 may also be formed on sidewall surfaces 130. Thin film 115 may be deposited by a process such as, for example, sputtering. "Sputtering" is a physical process in which atoms in a solid target material are ejected into the gas phase due to bombardment of the material by energetic ions. The resultant sputtering material is then deposited on a target substrate. Sputtering is typically conducted in a vacuum chamber and sputtering material tends to coat all surfaces within the vacuum chamber. In some embodiments, thin film 115 may be deposited as a tensile layer. This may be accomplished by closely controlling the deposition temperature, by pulsing the sputtering process and by using a reduced sputtering power. In the case that film 115 is $SiO_2$, for example, the temperature may be maintained below about 150° C., or below a temperature that may affect the polymer of first sacrificial layer 135. The power may be between about 275 Watts and 300 Watts. Pulsing may be controlled by a deposition of between about 30 seconds to 60 seconds, with a two minute rest in between, for a total deposition time of about 30 minutes.

FIG. 2C illustrates wire mesh 105 with first sacrificial layer 135 removed. First sacrificial layer 135 can be removed by a wet or dry cleaning process. In one embodiment, a wet cleaning process is used to remove first sacrificial layer 135. In one embodiment, a remover solution, such as WaferBond Remover (available from Brewer Science, U.S.A.), is poured into a beaker suitable for a precursor to a pellicle (for example, wire mesh 105) to be seated within. A stir bar is placed in the beaker and a fixture is used to suspend wire mesh 105. Wire mesh 105 is immersed in the remover solution with first sacrificial layer 135 facing the stir bar. The beaker is placed on a stir plate and heated to about 130° C. with a stir speed of about 200 revolutions per minute (rpm). Wire mesh 105 is allowed to process for approximately 1 hour. Wire mesh 105 is then removed from the remover solution and immersed in a container of rinse solution, such as, but not limited to, water, acetone, isopropyl alcohol or PSC developer. The container is gently shaken for between about 2 minutes and 3 minutes. Wire mesh 105 is then removed and the rinse operation is repeated at least 2 more times in a clean rinse solution. Wire mesh 105 is removed from the solution and allowed to dry in ambient air.

Following removal of first sacrificial layer 135, a capping process can be used to protect, for example, thin film 115 of silicon from oxidation. Suitable materials for the capping layer can be, but are not limited to, titanium, titanium-oxide or ruthenium. In some embodiments, the capping layer is 22 Angstroms (Å) Ti, 11 Å Ru, 22 Å Ru or 33 Å Ru. In one embodiment, the capping layer is 33 Å Ru. In this embodiment, the stable ruthenium capping layer helps to optimize membrane (tensile) at high transmission approximately 60%, or about 5-10% higher without the capping layer. It should be appreciated that the method described is performed with mesh 105 is in pellicle frame 115 (not shown).

Figure 3A:
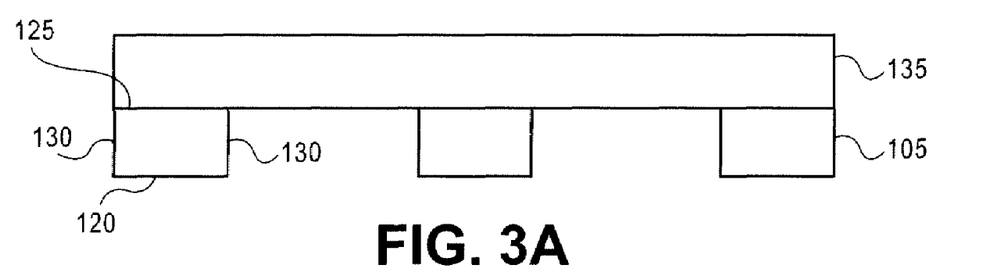
FIG. 3A illustrates forming a first sacrificial layer on a wire mesh according to an alternative embodiment of a method of fabrication of a pellicle for use in EUV lithography.

FIGS. 3A-3E illustrate an alternative embodiment of a method of fabrication of a pellicle for use in EUV lithography. In one embodiment, a first sacrificial layer 135 can be formed on wire mesh 105 (FIG. 3A). Each interlocking member includes two planar surfaces 120 and 125, and sidewall surfaces 130. In some embodiments, a high surface tension solution, such as a water-soluble polymer, can be deposited on surfaces 125 of wire mesh 105, forming first sacrificial layer 135. Examples of polymers may include those polymers listed above. First sacrificial layer 135 may be formed by a process such as dipping, as described previously.

Figure 3B:
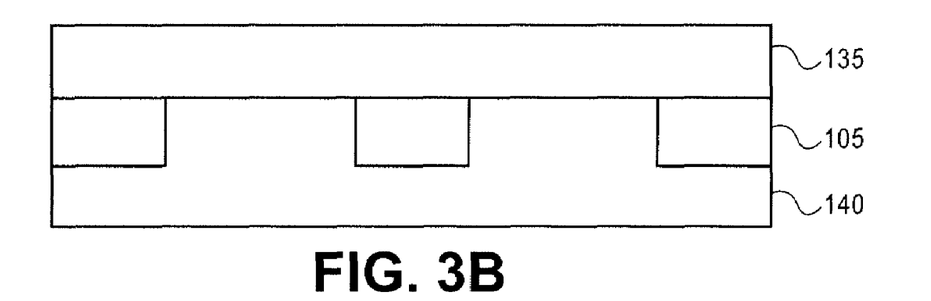
FIG. 3B illustrates forming a second sacrificial layer on a wire mesh according to an alternative embodiment of a method of fabrication of a pellicle for use in EUV lithography.

FIG. 3B illustrates second sacrificial layer 140 deposited on opposing surfaces 120 (relative to surfaces 125) and on sidewalls 130 of wire mesh 105. In some embodiments, a low surface tension solution, such as a non-water-soluble polymer, can be deposited on surfaces 125 and sidewall surfaces 130 of wire mesh 105, forming second sacrificial layer 140. The low surface tension characteristic of the polymer may allow coating on remaining exposed surfaces 124 and 130 of wire mesh 105. Additionally, the polymer can have a characteristic such that it does not dissolve the polymer of first sacrificial layer 135. An example of a polymer may include, but is not limited to, WaferBond (available from Brewer Science, U.S.A.), or a solution that is about 95% 1-dodecene. Second sacrificial layer 140 may be formed by a process such as dipping.

In one embodiment, the water is poured into a container suitable for a precursor to a pellicle (for example, wire mesh 105) to be seated within. Wire mesh 105 is gently placed on the surface of the water. A low surface tension polymer in organic solvent is pipetted on wire mesh 105. The solvent is allowed to substantially or completely evaporate. Wire mesh is then removed from the water and allowed to dry in ambient air, forming second sacrificial layer 140. If needed, outgassing can be performed in an oven thereafter. The thickness of second sacrificial layer 140 may be between about 50 μm and 1 mm.

Figure 3C:
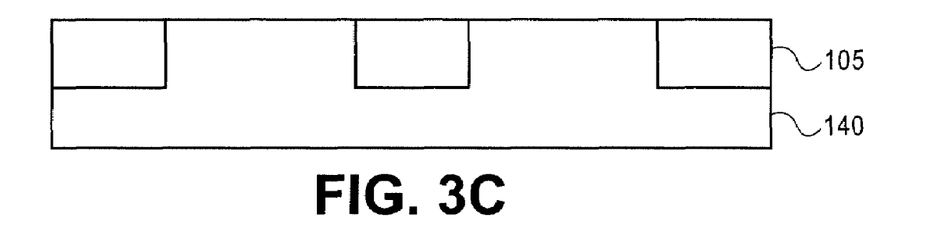
FIG. 3C illustrates forming a thin film on a wire mesh according to an alternative embodiment of a method of fabrication of a pellicle for use in EUV lithography.

FIG. 3C illustrates wire mesh 105 with first sacrificial layer 135 removed and second sacrificial layer 140 remaining. First sacrificial layer 135 can be removed by a wet or dry cleaning process such as described previously.

Figure 3D:
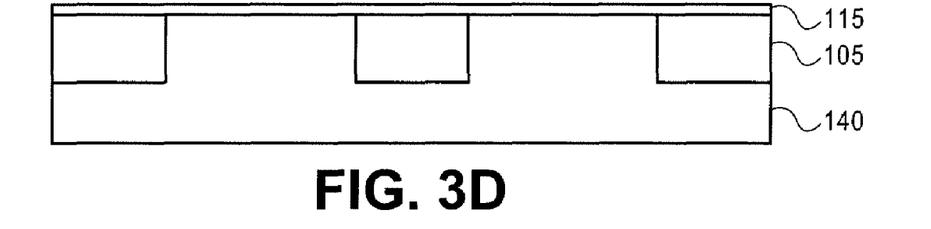
FIG. 3D illustrates removing a first sacrificial layer on a wire mesh according to an alternative embodiment of a method of fabrication of a pellicle for use in EUV lithography.

FIG. 3D illustrates wire mesh 105 with thin film 115 coated thereon and with second sacrificial layer 140 remaining thereon. Thin film 115 may be formed on exposed surfaces 125 while second sacrificial layer 140 remains. Thin film 115 may be deposited by a sputtering process, such as the process previously described, with similar conditions.

Figure 3E:
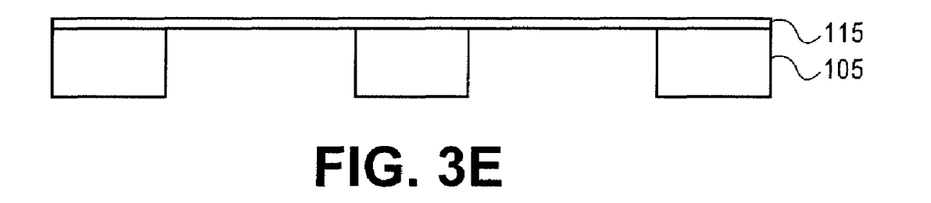
FIG. 3E illustrates removing a second sacrificial layer on a wire mesh according to an alternative embodiment of a method of fabrication of a pellicle for use in EUV lithography.

FIG. 3E illustrates wire mesh 105 with thin film 115 coated thereon. Second sacrificial layer 140 can be removed by a wet or dry cleaning process. In one embodiment, second sacrificial layer 140 is removed by a wet cleaning process, such as described previously. It should be appreciated that the method described is performed with mesh 105 is in pellicle frame 115 (not shown).

Figure 4:
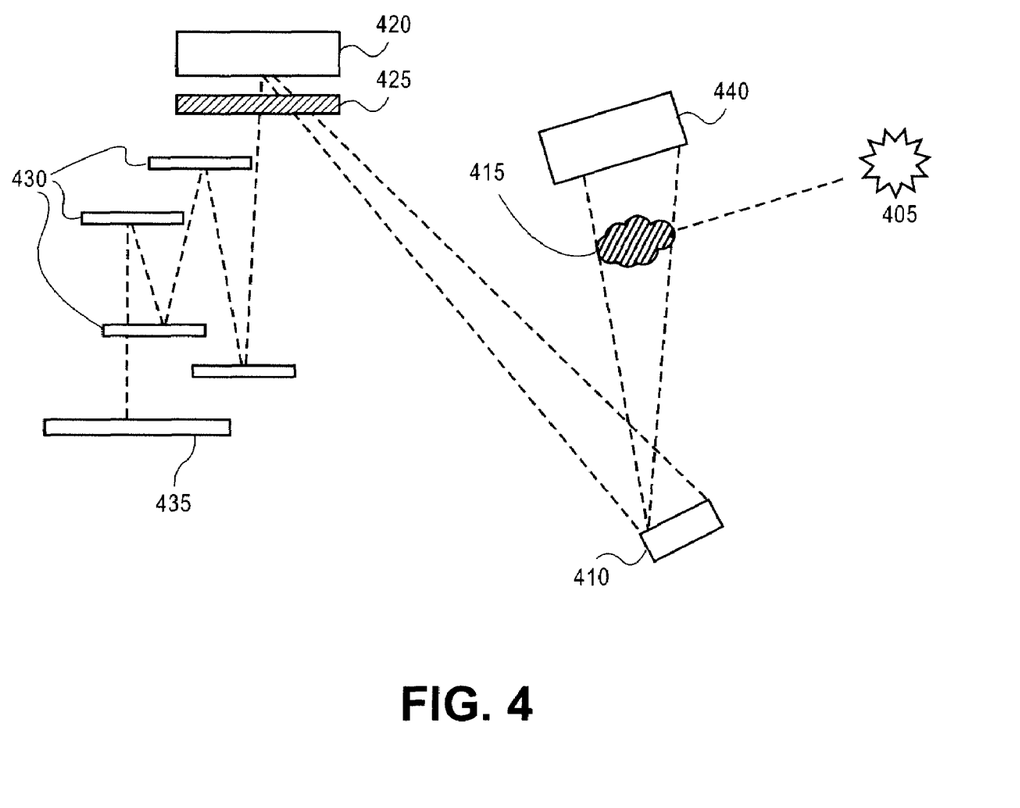
FIG. 4 illustrates an embodiment of a method of use of a pellicle in EUV lithography.

FIG. 4 illustrates an embodiment of a system employing the use of a pellicle in EUV lithography, which is performed in a vacuum system. In one embodiment, EUV light can be indirectly projected to substrate 435 through a series of mirrors 430 to produce an image on substrate 435 in a EUV photolithography process. In one embodiment, laser 405 can be directed at a jet of xenon gas, which heats the gas and creates plasma 415. The xenon gas is generated from EUV source/collector 440. Electrons from plasma 415 are released and radiate light, for example, at 13 nanometers, in addition to other wavelengths, i.e., infrared (IR) and deep ultraviolet wavelengths (DUV). The light travels through condenser 410, which gathers the light to be directed at photomask 420. Pellicle 425 is situated in the pathway of condensed light from condenser optics 410 to photomask 420 and may function to trap particles which may affect the quality of the image on substrate 435. Pellicle 425 may be situated at about 5 mm to about 6 mm from photomask 420. The EUV light is reflected off of a series of mirrors 430 (typically between 4 and 6 mirrors and typically curved), reducing the size of the image and focusing the image on substrate 435.

A pellicle according to embodiments of the invention may be used to protect photomasks from particulates as small as about 30 nm. When lodged on a photomask, these particulates may be imaged on a substrate compromising the integrity of the substrate. These particulates are generally difficult to detect and difficult to remove when lodged on the photomask. Illumination uniformity can be controlled to within +/−1% by optimizing wire mesh parameters, such as pitch, wire width and cell geometry. Moreover, the material of the thin film can affect transmission quality.

Alternatively, a pellicle according to embodiments of the invention may be used as a spectral purity filter (SPF). A spectral purity filter is a filter which can filter out contaminant wavelengths, such as IR and DUV wavelengths, in a EUV lithography process. A SPF may be positioned between condenser optics 410 and photomask 420, substantially near condenser optics 410. Typically, zirconium foils are used as SPFs; however, such foils are extremely fragile and break down in a vacuum system, causing extended process downtime and decreased throughput. Thus, use of a pellicle according to embodiments of the invention may provide a more robust means to filter out contaminant wavelengths in EUV lithography thereby increasing throughput.

Figure 5:
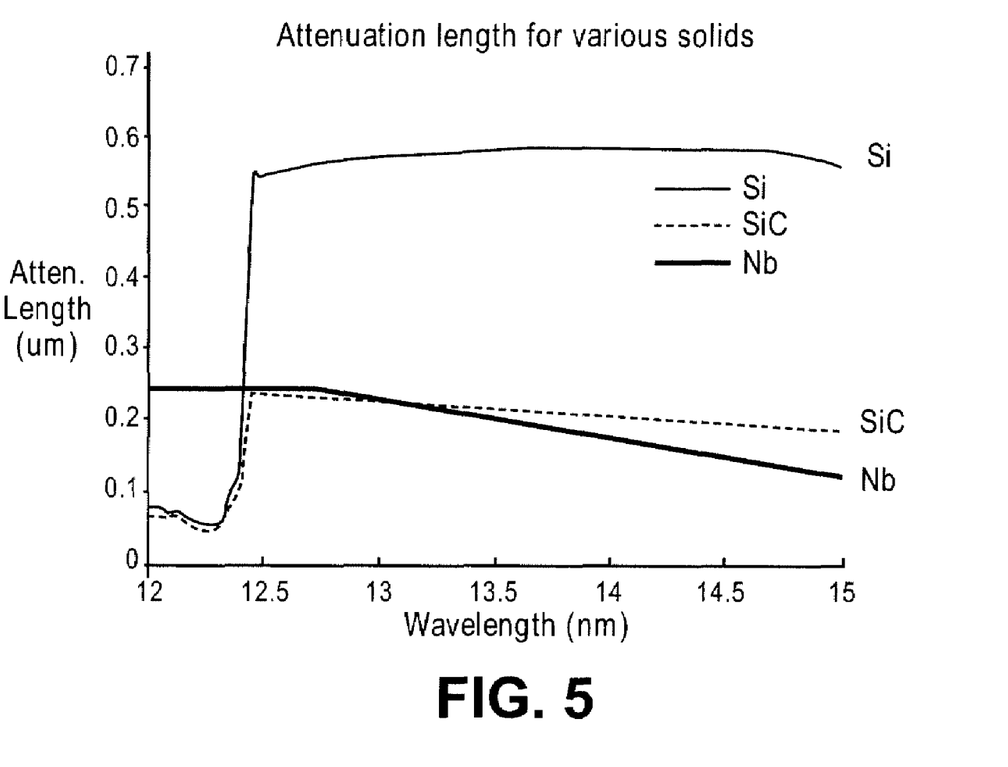
FIG. 5 shows a graph of attenuation length plotted against wavelength for three different materials.

FIG. 5 shows a graph comparing different materials which may be used for the thin film in embodiments of a pellicle according to the invention. The attenuation length for silicon, silicon carbide and niobium were plotted against wavelength. "Attenuation" is the reduction in intensity of the light beam with respect to distance traveled through a transparent medium. According to the graph, silicon had the highest attenuation length at about 580 nm at 13.5 nm wavelength. In other words, silicon provides the highest transmission of EUV radiation near 13.5 nm wavelength. Other materials may be appropriate depending on the thickness of the material. For example, silicon carbide at a thickness of 20 nm may be a viable alternative.

Figure 6A:
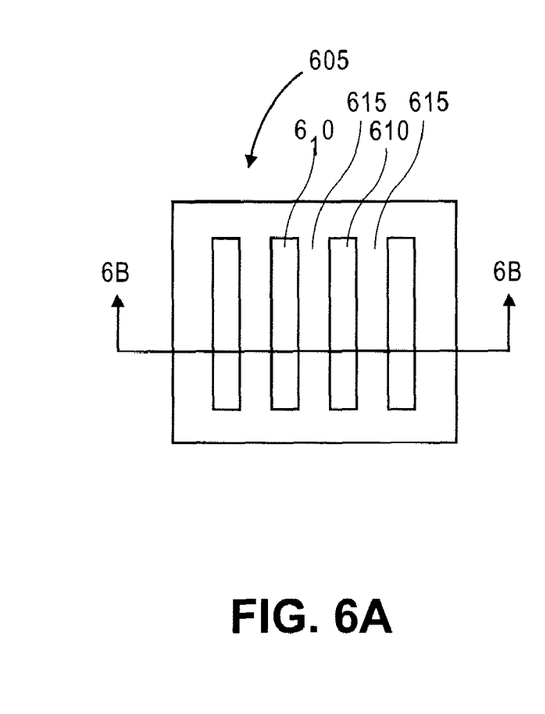
FIG. 6A illustrates an embodiment of a patterned wafer
Figure 6B:
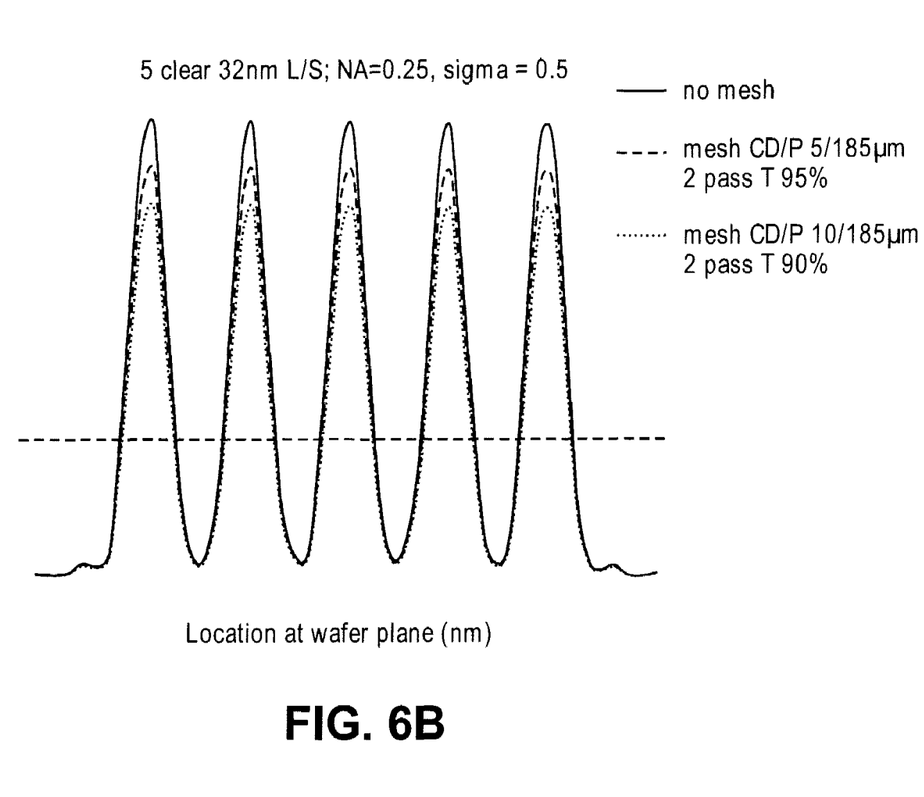
FIG. 6B shows a graph comparing transmission characteristics using two embodiments of a pellicle and using no pellicle in EUV lithography.

FIG. 6 shows a graph comparing transmissive characteristics using no pellicle and using two different pellicles according to embodiments of the invention on a substrate. EUV photolithography was used to form a 32 nm L/S pattern on a substrate for all three cases (FIG. 6A). Referring to the graph in FIG. 6B, each peak corresponds to an interconnect 610, while each valley corresponds to source/drain regions 615 adjacent to interconnects 610. With no pellicle, transmissiveness is 100% on wafer substrate 605. Using a pellicle including a wire mesh of square configuration with a wire width of 5 μm and a pitch of 185 μm, transmissiveness is about 95% for two passes. Using a pellicle including a wire mesh of square configuration with a wire width of 10 μm and a pitch of 185 μm, transmissiveness is about 90% for two passes. Applicants conclude that the wire mesh pellicle does not significantly affect the final image at the wafer plane. Applicants conclude that the loss of image fidelity (normalized image log slope, or NILS, at printing threshold and contrast) is minimal.

In the foregoing specification, specific embodiments have been described. It will, however, be evident that various modifications and changes can be made thereto without departing from the broader spirit and scope of the appended claims. The specification and drawings are, accordingly, to be regarded in an illustrative rather than a restrictive sense.

What is claimed is:

1. A pellicle, comprising:
   a support platform comprising a plurality of interlocking evenly-spaced members defining a plurality of openings therebetween; and
   a film dispersed throughout the plurality of openings and on at least one surface of the interlocking members,
   wherein the film is capped on each surface with a capping layer, and the film is transmissive to extreme ultraviolet light.

2. The pellicle of claim 1, wherein the support platform is a wire mesh.

3. The pellicle of claim 1, wherein the openings comprise a geometric configuration of one of hexagonal or square, the openings having a pitch of between 50 micrometers and 500 micrometers.

4. The pellicle of claim 2, wherein the wire mesh comprises one of nickel, tungsten or gold-coated tungsten with a wire thickness range of between 2 micrometers and 20 micrometers.

5. The pellicle of claim 1, wherein the film comprises one of silicon, silicon carbide or niobium.

6. The pellicle of claim 5, wherein the film is silicon and is capped on each surface of the film with a layer of one of titanium-oxide or ruthenium.

7. The pellicle of claim 1, wherein the film has a thickness in a range of between 50 nanometers and 150 nanometers.

8. The pellicle of claim 1, wherein the capping layer is in a range of between 2 nanometers and 4 nanometers.

9. The pellicle of claim 1, wherein the support platform is situated within a pellicle frame.

\* \* \* \* \*

UNITED STATES PATENT AND TRADEMARK OFFICE
CERTIFICATE OF CORRECTION

PATENT NO.      : 7,666,555 B2                                    Page 1 of 1
APPLICATION NO. : 11/618487
DATED           : February 23, 2010
INVENTOR(S)     : Goldstein et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 399 days.

Signed and Sealed this

Fourth Day of January, 2011

David J. Kappos
*Director of the United States Patent and Trademark Office*